United States Patent
Lee et al.

(10) Patent No.: US 8,809,933 B2
(45) Date of Patent: Aug. 19, 2014

(54) BIT LINE STRUCTURE, SEMICONDUCTOR DEVICE AND METHOD OF FORMING THE SAME

(75) Inventors: Guan-De Lee, Hsinchu (TW);
Chien-Hung Liu, Hsinchu (TW);
Shou-Wei Huang, Hsinchu (TW);
Ying-Tso Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 606 days.

(21) Appl. No.: 12/834,212

(22) Filed: Jul. 12, 2010

(65) Prior Publication Data

US 2011/0198698 A1    Aug. 18, 2011

(30) Foreign Application Priority Data

Feb. 12, 2010   (TW) ............................... 99104797 A

(51) Int. Cl.
*H01L 29/788* (2006.01)
*H01L 27/115* (2006.01)
*H01L 21/74* (2006.01)

(52) U.S. Cl.
CPC ........ *H01L 27/11568* (2013.01); *H01L 21/743* (2013.01)
USPC ...................... 257/316; 257/E29.17; 438/262

(58) Field of Classification Search
CPC .................. H01L 27/10888; H01L 27/10891; H01L 21/28282
USPC .......... 438/201, 211, 257, 262; 257/314, 315, 257/316, E21.682, E29.17
See application file for complete search history.

(56) References Cited

U.S. PATENT DOCUMENTS

| | | | | |
|---|---|---|---|---|
| 5,430,673 A * | 7/1995 | Hong et al. | ................... | 365/182 |
| 6,153,471 A | 11/2000 | Lee et al. | | |
| 7,049,652 B2 * | 5/2006 | Mokhlesi et al. | ............. | 257/315 |
| 2007/0269943 A1 | 11/2007 | Chen et al. | | |
| 2008/0042191 A1 | 2/2008 | Lin et al. | | |
| 2008/0149989 A1 * | 6/2008 | Cheng et al. | ................... | 257/316 |

OTHER PUBLICATIONS

"First Office Action of China Counterpart Application", issued on May 3, 2012, p. 1-p. 4, in which the listed reference was cited.
"Second Office Action of China Counterpart Application", issued on Jan. 15, 2013, p. 1-p. 4, in which the listed reference was cited.

* cited by examiner

*Primary Examiner* — David Vu
(74) *Attorney, Agent, or Firm* — J.C. Patents

(57) ABSTRACT

A semiconductor device including a substrate, a plurality of stacked gate structures, a plurality of doped regions, a plurality of liner layers, a plurality of conductive layers, a plurality of dielectric layers and a plurality of word lines is provided. The substrate has a plurality of trenches therein. The stacked gate structures are on the substrate between the trenches. The doped regions are in the substrate at sidewalls or bottoms of the trenches. The liner layers are on at least a portion of sidewalls of the stacked gate structures and on sidewalls of the trenches. The conductive layers are in the trenches and electrically connected to the doped regions. The dielectric layers are on the conductive layers and between the stacked gate structures. The word lines are on the substrate and electrically connected to the stacked gate structures.

10 Claims, 4 Drawing Sheets

BIT LINE STRUCTURE, SEMICONDUCTOR DEVICE AND METHOD OF FORMING THE SAME

CROSS-REFERENCE TO RELATED APPLICATION

This application claims the priority benefit of Taiwan application serial no. 99104797, filed on Feb. 12, 2010. The entirety of the above-mentioned patent application is hereby incorporated by reference herein and made a part of specification.

BACKGROUND OF THE INVENTION

1. Field of Invention

The present invention relates to a semiconductor method and a method of forming the same, and more generally to a non-volatile memory and a method of forming the same.

2. Description of Related Art

A non-volatile memory provides the property of multiple entries, retrievals and erasures of data, and is able to retain the stored information even when the electrical power is off. Therefore, a non-volatile memory is widely used in personal computers and consumer electronic products.

As the level of integration of a non-volatile memory is getting higher, the critical dimension such as the width of bit lines is accordingly reduced. However, a narrower width of the bit lines leads to higher resistance, so that the current of the memory cell is reduced and the over-high bit line loading is caused.

If the junction depth of the bit lines is increased to resolve the higher resistance of the bit lines, not only the short channel effect is generated, the problem of junction leakage also occurs. If a high concentration of dopant is used to form a shallow junction of the bit lines to obviate the short channel effect and the junction leakage problem caused by the deep junction, the overloading problem of the bit lines remains unresolved due to the limitation of the solid-state solubility.

SUMMARY OF THE INVENTION

Accordingly, the present invention provides a semiconductor device, in which the conductive layers serve as bit lines to reduce the bit line resistance and avoid over-high bit line loading.

The present invention further provides a method of forming a semiconductor device. The process is simple and easy, and the formed semiconductor device has lower bit line resistance.

The present invention also provides a bit line structure to avoid the short channel effect and the junction leakage problem.

The present invention provides a semiconductor device including a substrate, a plurality of stacked gate structures, a plurality of doped regions, a plurality of liner layers, a plurality of conductive layers and a plurality of word lines. The substrate has a plurality of trenches therein. The stacked gate structures are disposed on the substrate between the trenches. The doped regions are disposed in the substrate at sidewalls or bottoms of the trenches. The liner layers are disposed on at least a portion of sidewalls of the stacked gate structures and on the sidewalls of the trenches. The conductive layers are disposed in the trenches and electrically connected to the doped regions. The dielectric layers are disposed on the conductive layers and between the stacked gate structures. The word lines are disposed on the substrate and electrically connected to the stacked gate structures.

According to an embodiment of the present invention, the material of the conductive layers includes undoped or doped polysilicon, updoped or doped selective epitaxial silicon, metal, metal silicide or a combination thereof, for example.

According to an embodiment of the present invention, the top surfaces of the conductive layers are no higher than the top surface of the substrate.

According to an embodiment of the present invention, the semiconductor device further includes a well region disposed in the substrate, and the trenches are formed in the well region.

According to an embodiment of the present invention, the material of the liner layers includes a dielectric material, for example.

The present invention further provides a method of forming a semiconductor device. A plurality of stacked gate structures is formed on a substrate. A plurality of trenches is formed in the substrate between the stacked gate structures. A doped region is formed in the substrate adjacent to the sidewall or bottom of each trench. A liner layer is formed on the sidewall of each stacked structure and on the sidewall of each trench. A conductive layer is formed in each trench, wherein the conductive layers are electrically connected to the doped regions. A dielectric layer is formed on each conductive layer and between the stacked gate structures. A plurality of word lines is formed on the substrate, wherein the word lines are electrically connected to the stacked gate structures.

According to an embodiment of the present invention, the method further includes forming a spacer on the sidewall of each mask pattern before forming the stacked gate structures and the trenches.

According to an embodiment of the present invention, the material of the conductive layers includes undoped or doped polysilicon, undoped or doped selective epitaxial silicon, metal, metal silicide or a combination thereof, for example.

According to an embodiment of the present invention, the method of forming the doped regions includes performing at least one tilt ion implantation process, for example. The angle of the tilt ion implantation process is about 5-20 degrees, for example.

According to an embodiment of the present invention, the method further includes forming a well region in the substrate.

According to an embodiment of the present invention, the method of forming the liner layers includes the following steps. A liner material layer is conformally formed on the substrate covering sidewalls and tops of the stacked gate structures and sidewalls and bottoms of the trenches. A portion of the liner material layer on the tops of the stacked gate structures and at the bottoms of the trenches is removed.

According to an embodiment of the present invention, the method of forming the dielectric layers includes the following steps. A dielectric material layer is formed on the substrate covering the conductive layers, the liner layers and the stacked gate structures. An etching back process is performed, so as to remove a portion of the dielectric material layer and a portion of the liner layers simultaneously.

The present invention also provides a bit line structure including a substrate, a doped region and a conductive layer. The substrate has at least one trench therein. The doped region is disposed in the substrate at the sidewall or bottom of the trench. The conductive layer is disposed in the trench and electrically connected to the doped region.

According to an embodiment of the present invention, the material of the conductive layers includes undoped or doped polysilicon, undoped or doped selective epitaxial silicon, metal, metal silicide or a combination thereof, for example.

According to an embodiment of the present invention, the top surface of the conductive layers is no higher than that of the substrate.

According to an embodiment of the present invention, the bit line structure further includes a liner layer disposed on the sidewall of the trench. The material of the liner layer includes a dielectric material, for example.

In view of the above, the semiconductor device of the present invention uses the conductive layers as bit lines, so as to reduce the bit line resistance and avoid over-high bit line loading. Therefore, the read current loading is reduced, the threshold voltage variation is decreased, and the programming speed is increased. Further, the method of forming the semiconductor device of the present invention is simple and easy. The semiconductor device of the present invention can be formed with the existing manufacturing equipment, so that the competitive advantage can be achieved easily. In addition, the bit line structure of the present invention can avoid the short channel effect and the junction leakage problem.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
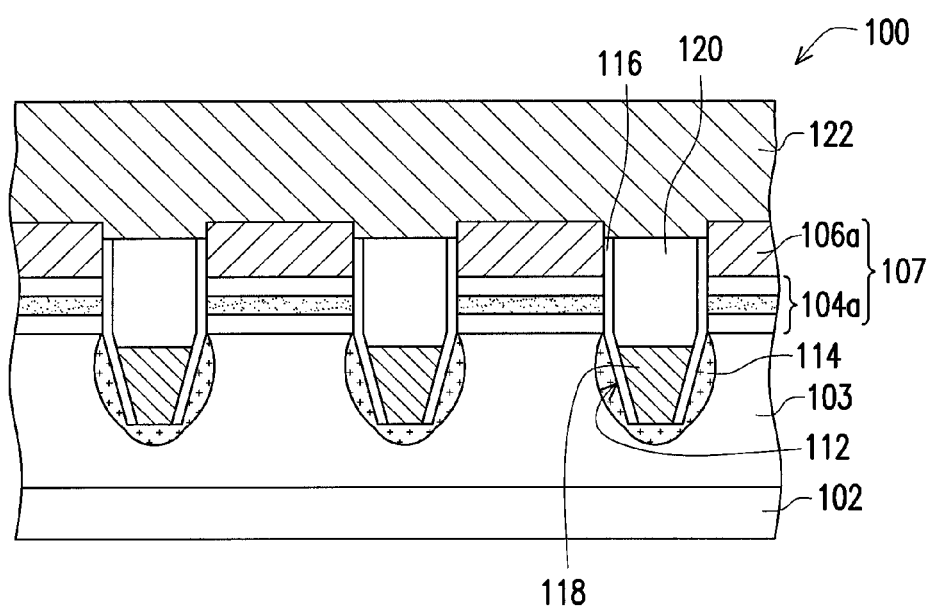
FIG. 1 schematically illustrates a cross-sectional view of a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 schematically illustrates a cross-sectional view of a semiconductor device according to an embodiment of the present invention.

Referring to FIG. 1, a semiconductor device 100 of the present invention includes a substrate 102, a well region 103, a plurality of stacked gate structures 107, a plurality of doped regions 114, a plurality of liner layers 116, a plurality of conductive layers 118, a plurality of dielectric layers 120 and a plurality of word lines 122.

The substrate 102 may be a silicon substrate. The substrate 102 has a plurality of trenches 112 therein. The well region 103 is disposed in the substrate 102. The trenches 112 are disposed in the well region 103. Each doped region 114 is disposed in the substrate 102 at the sidewall or bottom of the corresponding trench 112 and serves as source and drain regions. In an embodiment, each doped region 114 can be disposed in the substrate 102 at the sidewall and bottom of the corresponding trench 112, as shown in FIG. 1. In an embodiment, when the well region 103 is P-type, the doped regions 114 are N-type. In another embodiment, when the well region 103 is N-type, the doped regions 114 are P-type.

The stacked gate structures 107 are disposed on the substrate 102 between the trenches 112. Each stacked structure 107 includes a charge-storage structure 104a and a gate 106a sequentially disposed on the substrate 102. The charge-storage structure 104a is a silicon oxide/silicon nitride/silicon oxide (ONO) composite layer, and the gate 106a is a doped polysilicon layer, for example.

The conductive layers 118 are disposed in the trenches 112, electrically connected to a portion of the doped regions 114 below the trenches 112 and serve as bit lines. The resistance of the conductive layers 118 is less than that of the doped regions 114. The material of the conductive layers 118 includes updoped or doped polysilicon, undoped or doped selective epitaxial silicon, metal, metal silicide or a combination thereof, for example. When the conductive layers 118 includes doped polysilicon or doped selective epitaxial silicon, the dopant concentration thereof is higher than that of the doped regions 114.

The word lines 112 are disposed on the substrate 102 and electrically connected to the gates 106a. The word lines 112 include doped polysilicon or are formed by doped polysilicon and metal silicide, for example.

To ensure the conductive layers 118 not electrically connected to the gates 106a, in an embodiment, the top surfaces of the conductive layers 118 is no higher than the top surface of the substrate 102. In other words, the top surfaces of the conductive layers 118 can be substantially equal to or lower than the top surface of the substrate 102. In another embodiment, the liner layers 116 can be disposed on at least a portion of the sidewalls of the stacked gate structures 107 and on the sidewalls of the trenches 112. The material of the liner layers 116 includes a dielectric material, such as silicon oxide, and the thickness of the same is about 50-400 angstroms, for example. In yet another embodiment, the formation of the conductive layers 118 is controlled such that the top surfaces thereof are lower than the top surface of the substrate 102, and the liner layers 116 are disposed on a portion of the sidewalls of the stacked gate structures 107 and on the sidewalls of the trenches 112, as shown in FIG. 1.

The dielectric layers 120 are disposed between the stacked gate structures 107, on the conductive layers 118 and below the word lines 122. In an embodiment, the material of the dielectric layers 120 is the same as that of the liner layers 116, and the surfaces of the dielectric layers 120 are as high as those of the liner layers 116. The dielectric layers 120 and the liner layers 116 include silicon oxide, for example. In another embodiment, the material of the dielectric layers 120 is different from that of the liner layers 116.

In this embodiment, as shown in FIG. 1, the surfaces of the dielectric layers 120 and the liner layers 116 are higher than the charge-storage structures 104a but lower than the surfaces of the gates 106. However, the present invention is not limited thereto. In another embodiment (not shown), the surfaces of the dielectric layers 120 and the liner layers 116 can be equal to or higher than the surfaces of the gates 106a.

It is noted that the bit line structure of the present invention can be applied to not only the semiconductor device 100 but also the other suitable semiconductor devices. The bit line structure of the present invention includes a substrate 102, a doped region 114 and a conductive layer 118. The substrate 102 has at least one trench 112 therein. The doped region 114 is disposed in the substrate 102 at the sidewall or bottom of the trench 112. The conductive layer 118 is disposed in the trench 112 and electrically connected to the doped region 114.

In the semiconductor device 100 of the present invention, the conductive layers 118 serve as bit lines. The resistance of the conductive layers 118 is lower, so that the bit line resistance can be reduced effectively. The lower bit line resistance can reduce the read current loading, so as to decrease the threshold voltage (Vt) variation and increase the programming speed. Further, the portion of the doped regions 114 below the conductive layers 118 can effectively suppress the punch through effect.

In addition, in the semiconductor device 100 of the present invention, each liner layer 116 of silicon oxide is disposed between a conductive layer 118 serving as a bit line and a charge-storage structure 104a, so as to electrically isolate the conductive layers 118 from the charge-storage structures 104a effectively, and thus, a leakage current is not observed.

FIGS. 2A to 2F schematically illustrate cross-sectional views of a method of forming a semiconductor device according to an embodiment of the present invention.

Figure 2A:
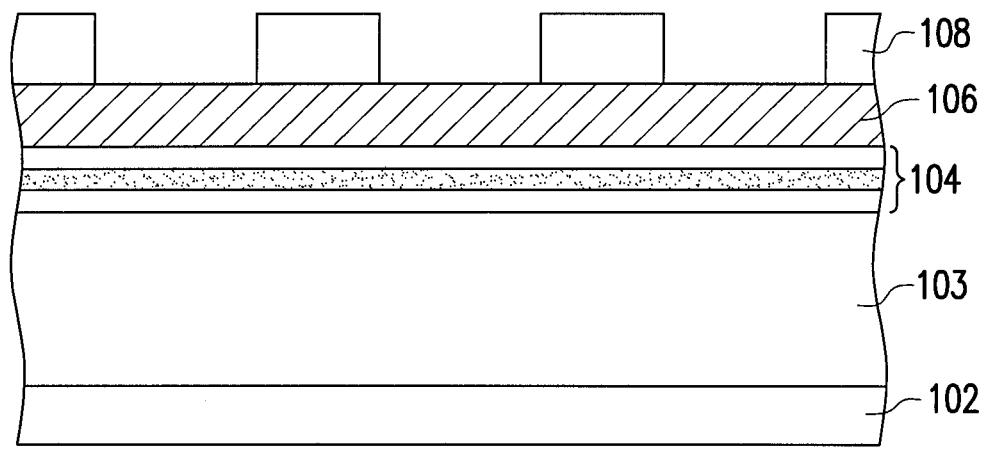
FIGS. 2A to 2F schematically illustrate cross-sectional views of a method of forming a semiconductor device according to an embodiment of the present invention.

Referring to FIG. 2A, a charge-storage structure material layer 104, a gate material layer 106 and a plurality of mask patterns 108 are sequentially formed on a substrate 102. The substrate 102 may be a silicon substrate. The material of the gate material layer 106 includes doped polysilicon and the thickness of the same is about 500-2000 angstroms, for example. The charge-storage structure material layer 104 is an ONO composite layer, for example. The method of forming the charge-storage structure material layer 104 and the gate material layer 106 includes performing a chemical vapour deposition (CVD) process, for example. In an embodiment, a well region 103 can be optionally formed in the substrate 102 before the step of forming the charge-storage structure material layer 104. The method of forming the well region 103 includes performing an ion implantation process, for example.

The material of the mask patterns 108 includes silicon oxide, silicon nitride or silicon oxynitirde, for example. The method of forming the mask patterns 108 includes the following steps. First, a mask material layer (not shown) and a bottom anti-reflection coating (BARC) layer (not shown) and a patterned photoresist layer (not shown) are sequentially formed on the gate material layer 106. The mask material layer is a silicon nitride layer of 1000-2000 angstroms thick, and the forming method thereof includes performing a CVD process, for example. Thereafter, the BARC layer and the mask material layer are sequentially patterned by using the patterned photoresist layer as a mask. Afterwards, the patterned photoresist layer and the BARC layer are removed.

Figure 2B:
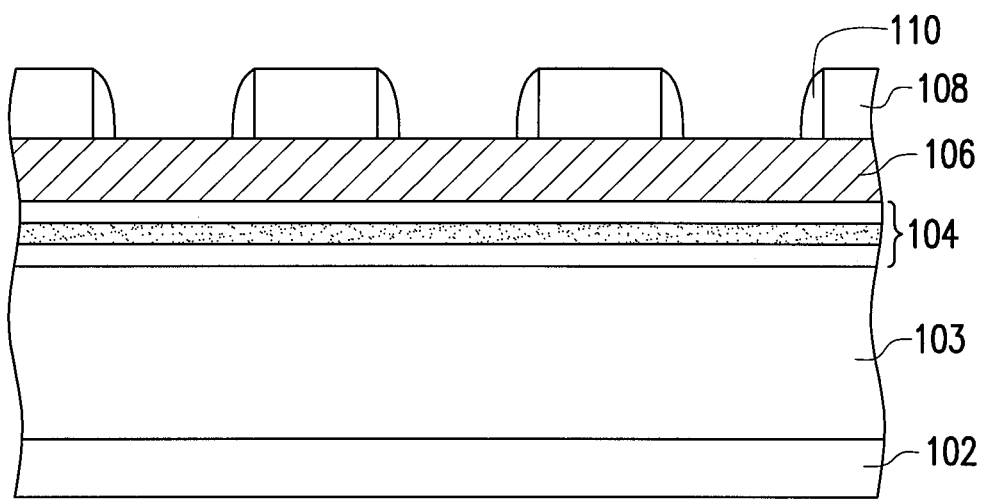

Referring to FIG. 2B, a spacer 110 is formed on the sidewall of each mask pattern 108. The formation of the spacers 110 is for reducing the gaps between the mask patterns 108. The material of the spacers 110 includes silicon oxide, silicon nitride or silicon oxynitride, for example. The material of the spacers 110 can be the same as or different from that of the mark patterns 108. The method of forming the spacers 110 includes conformally forming a spacer material layer (not shown) on the gate material layer 106 covering the mask patterns 108, and then performing an anisotropic etching process to the spacer material layer.

Figure 2C:
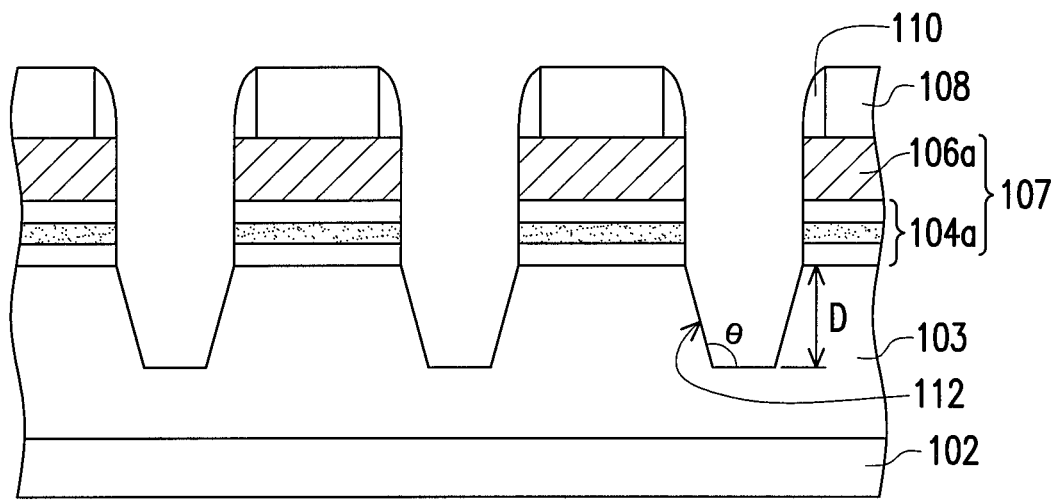

Referring to FIG. 2C, an etching process is performed, using the mask patterns 108 and the spacers 110 as a mask, so as to sequentially removing a portion of the gate material layer 106, a portion of the charge-storage structure material layer 104 and a portion of the substrate 102, and thus, a plurality of stacked gate structures 107 is formed on the substrate 102 and a plurality of trenches 112 is formed in the substrate 102 between the stacked gate structures 107. Each stacked structure 107 includes a charge-storage structure 104a and a gate 106a sequentially disposed on the substrate 102. The depth D of each trench 112 is about 100-500 angstroms, for example. The included angle θ between the sidewall and the bottom of each trench 112 is about 90-160 degrees, for example.

Figure 2D:
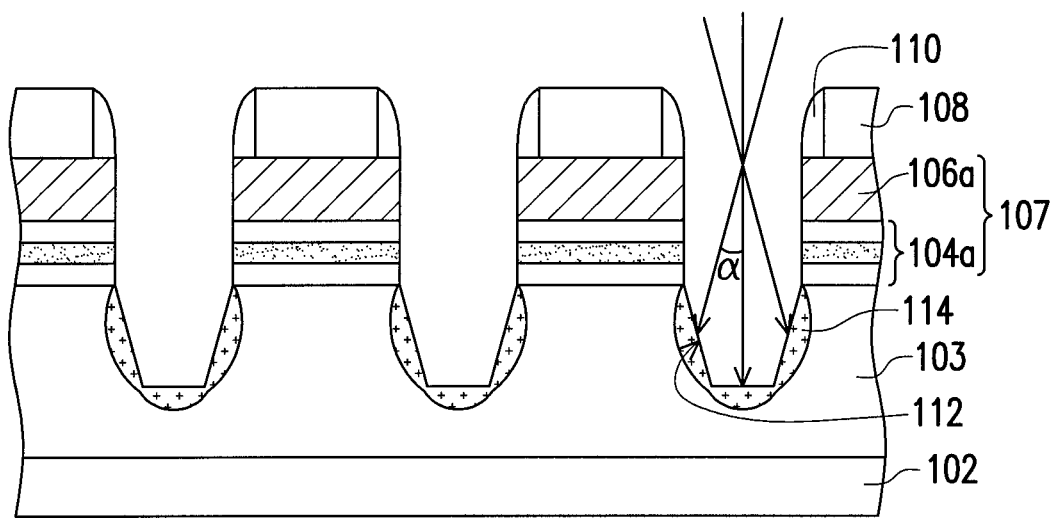

Referring to FIG. 2D, a doped region 114 is formed in the substrate 102 adjacent to the sidewall and the bottom of each trench 112. The method of forming the doped regions 114 includes performing at least two tilt ion implantation process and a vertical ion implantation process, for example. The angle α of the tilt ion implantation process is about 5-20 degrees, so as to form the portion of each doped region 114 adjacent to the sidewall of the corresponding trench 112. The angle of the vertical ion implantation process is about 0 degree, so as to form the portion of each doped region 114 adjacent to the bottom of the corresponding trench 112. This embodiment in which three ion implantation processes are performed to form the doped regions 114 each adjacent to the sidewall and the bottom of the corresponding trench 112 is provided for illustration purposes, and is not construed as limiting the present invention. It is appreciated by persons skilled in the art that the number, depth or dose of the ion implantation can be adjusted upon the process requirement. In an embodiment, each doped region 114 can be formed in the substrate 102 adjacent to the sidewall or bottom of the corresponding trench 112; that is, the method of forming the doped regions 114 only includes performing at least one tilt ion implantation process or a vertical ion implantation process.

Figure 2E:
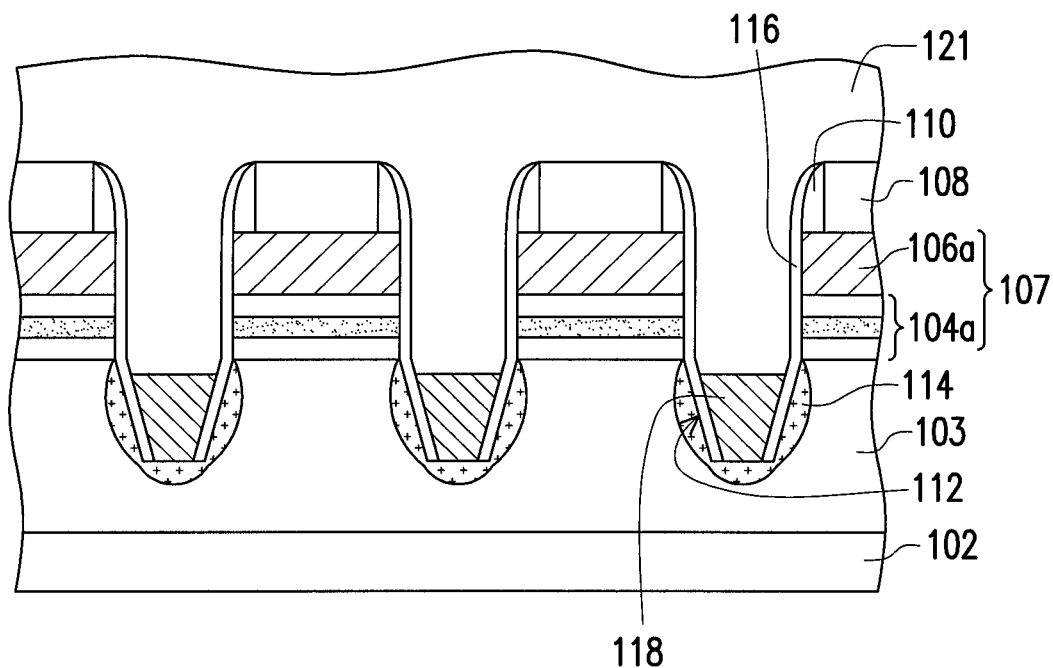

Referring to FIG. 2E, liner layers 116 are formed on the sidewalls of the stacked gate structures 107 and on the sidewalls of the trenches 112. The material of the liner layers 116 is different from that of the spacers 110 and includes silicon oxide, for example. The method of forming the liner layers 116 includes conformally forming a liner material layer (not show) on the substrate 102 covering the sidewalls and tops of the stacked gate structures 107 and the sidewalls and bottoms of the trenches 112. The material of the liner material layer includes a dielectric material. For example, the liner material layer is a silicon oxide layer of about 50-400 angstroms thick. The method of forming the liner material layer includes performing a CVD process, for example. Thereafter, an etching back process is performed to the liner material layer, so as to remove a portion of the liner material layer on the tops of the stacked gate structures and at the bottoms of the trenches 112.

Afterwards, conductive layers 118 are formed in the trenches 112. The material of the conductive layers 118 includes undoped or doped polysilicon, undoped or doped selective epitaxial silicon, metal, metal silicide or a combination thereof, for example. In an embodiment, the material of the conductive layers 118 is doped selective epitaxial silicon, and the forming method of the same includes performing a selective epitaxial growth (SEG) process or a selective CVD process, for example, so as to grow or deposit the conductive layers 118 from the bottoms of the trenches 112 to the required height. Alternatively, in another embodiment, the material of the conductive layers 118 is undoped or doped polysilicon, and the forming method of the same includes forming a conductive material layer (not shown) on the substrate 102 covering the stacked gate structures 107, and then performing an etching back process to the conductive material layer to remove a portion of the conductive material layer. The material of the conductive layers 118 can be metal (e.g. Al, Cu or W) or metal silicide if the process is controlled appropriately without any metal contamination between the front-end and the back-end processes. This embodiment in which the conductive layers 118 include a single material is provided for illustration purposes, and is not construed as limiting the present invention. It is appreciated by persons skilled in the art that each conductive layer 118 can be designed as a stacked structure including, for example, a bottom polysilicon layer and a top metal silicide layer upon the process requirement.

In an embodiment, the top surfaces of the conductive layers 118 are no higher than the top surface of the substrate 102. In other words, the top surfaces of the conductive layers 118 can be substantially equal to or lower than the top surface of the substrate 102. Preferably, the top surfaces of the conductive layers 118 are lower than the top surface of the substrate 102.

Figure 2F:
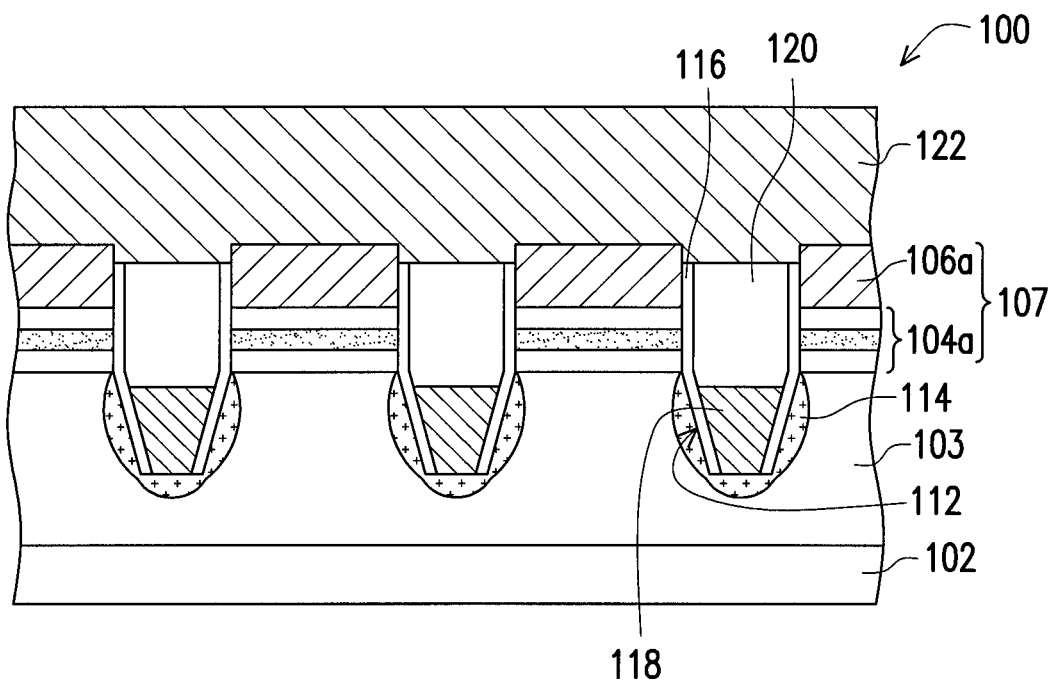

Referring to FIG. 2F, dielectric layers 120 are formed on the conductive layers 118 and between the stacked gate structures 107. In an embodiment, the material of the dielectric layers 120 is the same as that of the liner layers 116. The dielectric layers 120 and the liner layers 116 include silicon oxide, for example. The method of forming the dielectric layers 120 includes forming a dielectric material layer 121 (as shown in FIG. 2E) on the substrate 102 covering the conductive layers 114, the liner layer 116 and the stacked gate structures 107. Thereafter, an etching back process is performed to the dielectric material layer 121, so as to remove a portion of the dielectric material layer 121. Since the dielectric layers 120 and the liner layers 116 include the same material (e.g. silicon oxide), a portion of the liner layers 116 is removed during the step of removing the portion of the dielectric material layer 121. Therefore, the surfaces of the formed dielectric layers 120 are as high as those of the resulting liner layers 116. In another embodiment, the material of the dielectric layers 120 can be different from that of the liner layers 116.

In this embodiment, as shown in FIG. 2F, the surfaces of the dielectric layers 120 and the liner layers 116 are higher than the charge-storage structures 104a but lower than the surfaces of the gates 106a. However, the present invention is not limited thereto. In another embodiment (not shown), the surfaces of the dielectric layers 120 and the liner layers 116 can be equal to or higher than the surfaces of the gates 106a.

Thereafter, the mask patterns 108 and the spacers 110 are removed. Afterwards, word lines 122 are formed on the substrate 102 covering the stacked gate structures 107, the liner layers 116 and the dielectric layers 120. The word lines 122 are electrically connected to the gates 106a. The semiconductor device 100 of the present invention is thus completed.

In summary, the semiconductor device of the present invention uses the conductive layers as bit lines, so as to reduce the bit line resistance and avoid over-high bit line loading. Further, the portion of the doped regions disposed below the conductive layers have the appropriate dopant concentration, so that the punch through effect can be suppressed effectively.

In addition, the method of forming the semiconductor device of the present invention is simple and easy. Since the formed semiconductor device has lower bit line resistance, the read current loading is reduced, the threshold voltage variation is decreased, and the programming speed is increased.

Besides, the bit line structure of the present invention can avoid the short channel effect and the junction leakage problem.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
   a substrate, having a plurality of trenches therein;
   a plurality of stacked gate structures, disposed on the substrate between the trenches;
   a plurality of doped regions, disposed in the substrate at sidewalls or bottoms of the trenches;
   a plurality of liner layers, disposed on at least a portion of sidewalls of the stacked gate structures and on sidewalls of the trenches in the substrate;
   a plurality of conductive layers, disposed in the trenches and a bottom of each of the plurality of conductive layers electrically connected to the doped regions, and sidewalls of the plurality of conductive layers disposed in the trench in the substrate insulated from the plurality of doped regions by the plurality of liner layers;
   a plurality of dielectric layers, disposed on the conductive layers and between the stacked gate structures; and
   a plurality of word lines, disposed on the substrate and electrically connected to the stacked gate structures.

2. The semiconductor device of claim 1, wherein a material of the conductive layers comprises undoped or doped polysilicon, undoped or doped selective epitaxial silicon, metal, metal silicide or a combination thereof.

3. The semiconductor device of claim 1, wherein top surfaces of the conductive layers are no higher than a top surface of the substrate.

4. The semiconductor device of claim 1, further comprising a well region disposed in the substrate, and the trenches are formed in the well region.

5. The semiconductor device of claim 1, wherein a material of the liner layers comprises a dielectric material.

6. A bit line structure, comprising:
   a substrate, having at least one trench therein;
   a doped region, disposed in the substrate at a sidewall and continuously extending to a bottom of the trench;
   a liner layer disposed on the sidewall of the trench in the substrate; and
   a conductive layer, disposed in the trench and a bottom of the conductive layer electrically connected to the doped region, and sidewalls of the conductive layer insulated from the doped region by the liner layer.

7. The bit line structure of claim 6, wherein a material of the conductive layers comprises undoped or doped polysilicon, undoped or doped selective epitaxial silicon, metal, metal silicide or a combination thereof.

8. The bit line structure of claim 6, wherein a top surface of the conductive layers is no higher than a top surface of the substrate.

9. The bit line structure of claim 6, further comprising a liner layer disposed on the sidewall of the trench.

10. The bit line structure of claim 9, wherein a material of the liner layer comprises a dielectric material.

* * * * *